(12) United States Patent
Guo et al.

(10) Patent No.: US 10,965,304 B2
(45) Date of Patent: Mar. 30, 2021

(54) N-BIT HYBRID STRUCTURE ANALOG-TO-DIGITAL CONVERTER AND INTEGRATED CIRCUIT CHIP INCLUDING THE SAME

(71) Applicant: Radiawave Technologies Co., Ltd., Shenzhen (CN)

(72) Inventors: Xiaofeng Guo, Shenzhen (CN); Haigang Feng, Shenzhen (CN); Jon Sweat Duster, Beaverton, OR (US); Ning Zhang, Shenzhen (CN); Yulin Tan, Shenzhen (CN)

(73) Assignee: Radiawave Technologies Co., Ltd., Shenzhen (CN)

( * ) Notice: Subject to any disclaimer, the term of this patent is extended or adjusted under 35 U.S.C. 154(b) by 0 days.

(21) Appl. No.: 16/758,518

(22) PCT Filed: Nov. 6, 2018

(86) PCT No.: PCT/CN2018/114041
§ 371 (c)(1),
(2) Date: Apr. 23, 2020

(87) PCT Pub. No.: WO2019/091358
PCT Pub. Date: May 16, 2019

(65) Prior Publication Data
US 2020/0259500 A1    Aug. 13, 2020

(30) Foreign Application Priority Data

Nov. 7, 2017  (CN) .......................... 201711096513.7

(51) Int. Cl.
*H03M 1/12*   (2006.01)
*H03M 1/46*   (2006.01)

(52) U.S. Cl.
CPC ......... *H03M 1/1245* (2013.01); *H03M 1/468* (2013.01)

(58) Field of Classification Search
CPC ..... H03M 1/1245; H03M 1/468; H03M 1/145
(Continued)

(56) References Cited

U.S. PATENT DOCUMENTS 9,654,127 B1   5/2017  Lin et al.
9,843,340 B2 * 12/2017  Funato .................... H03M 1/06
(Continued)

FOREIGN PATENT DOCUMENTS

CN    204376879 U    6/2015
CN    105187067 A    12/2015
(Continued)

OTHER PUBLICATIONS

First Office Action in counterpart Chinese Application 201711096513.7, dated May 30, 2018.
(Continued)

*Primary Examiner* — Lam T Mai
(74) *Attorney, Agent, or Firm* — Westbridge IP LLC

(57) ABSTRACT

The present application discloses an N-bit hybrid-structure analog-to-digital converter and an integrated circuit chip including the same, including a pre-stage sampling capacitor array, a post-stage capacitor array and a comparator set and the pre-stage sampling capacitor array including a number of $2^N-1$ sets of first capacitor array units arranged in parallel, the first capacitor array unit including two sets of parallel capacitor strings, input terminals of parallel capacitor strings respectively being connected to and switchable between differential analog signals and first preset reference signals, output terminals of the parallel capacitor strings respectively being connected to input terminals of the comparator set, input terminals of the post-stage capacitor array respectively (Continued)

being connected to and switchable between output terminals of the comparator set and differential analog signals, output terminals of the post-stage capacitor array being configured as an output terminal of the analog-to-digital converter.

16 Claims, 1 Drawing Sheet

(58) Field of Classification Search
USPC .................................................. 341/155–172
See application file for complete search history.

(56) References Cited

U.S. PATENT DOCUMENTS

| | | |
|---|---|---|
| 2004/0227654 A1 | 11/2004 | Yang |
| 2004/0263376 A1* | 12/2004 | Shimizu ................ H03M 1/142 341/172 |
| 2010/0026546 A1 | 2/2010 | Ohnhaeuser et al. |

FOREIGN PATENT DOCUMENTS

| | | |
|---|---|---|
| CN | 106209102 A | 12/2016 |
| CN | 206164507 U | 5/2017 |
| CN | 107113003 A | 8/2017 |
| CN | 107733436 A | 2/2018 |

OTHER PUBLICATIONS

International Search Report in corresponding PCT Application PCT/CN2018/114041, dated Feb. 13, 2019.

* cited by examiner

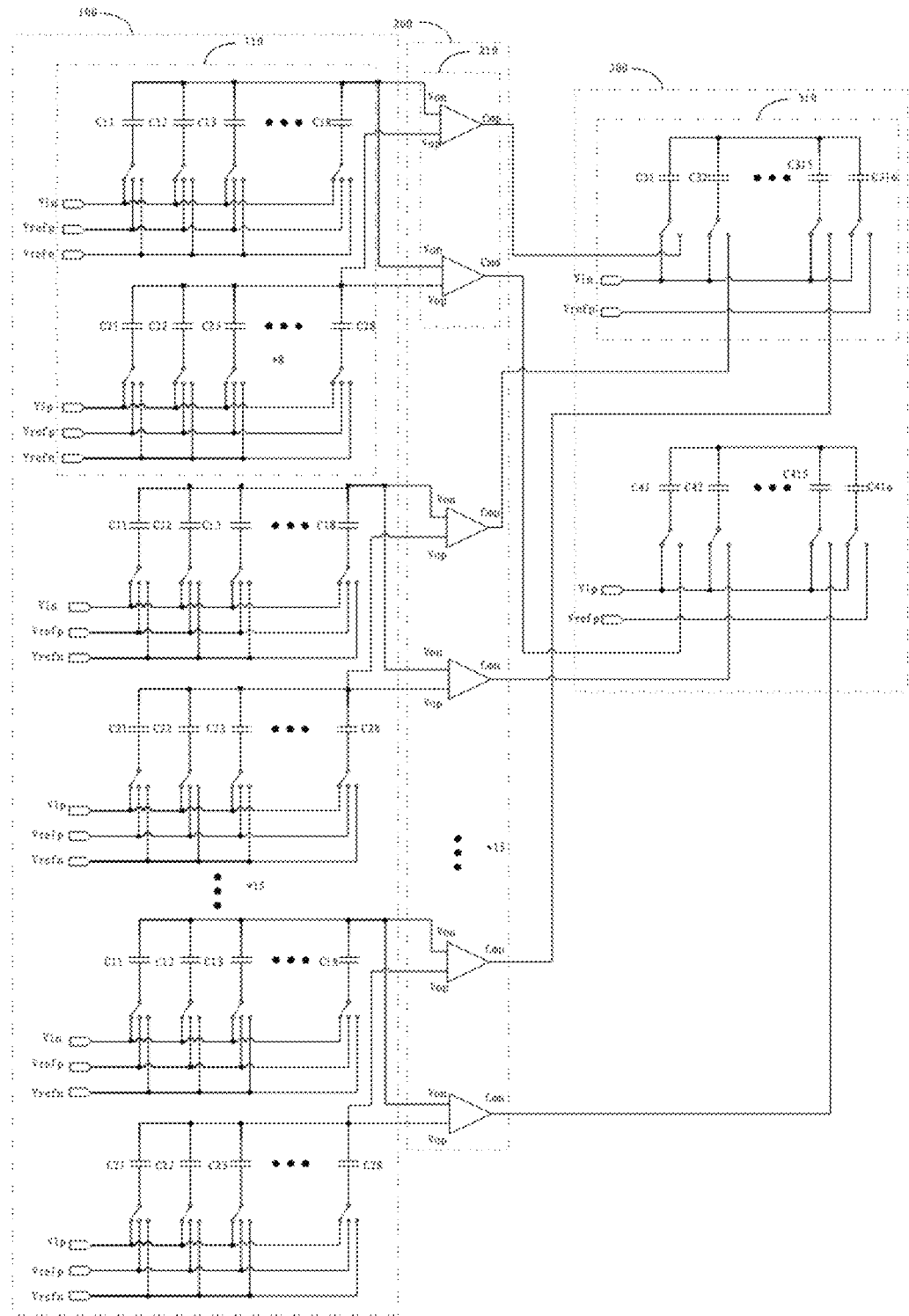

N-BIT HYBRID STRUCTURE ANALOG-TO-DIGITAL CONVERTER AND INTEGRATED CIRCUIT CHIP INCLUDING THE SAME

FIELD

The present application relates to the technical field of integrated circuits, and more particularly relates to an N-bit hybrid structure analog-to-digital converter and an integrated circuit chip including the same.

BACKGROUND

According to different performance characteristics of ADCs (Analog-to-Digital Converters) on the current market, the ADCs are mainly divided into the following several structures: successive approximation analog-to-digital converters (SAR ADC), pipeline analog-to-digital converters (pipeline ADC), full flash analog-to-digital converters (FLASH ADC), time-interleaved analog-to-digital converters (time-interleaved ADC), sigma-delta analog-to-digital converters (sigma-delta ADC). Different structures have different advantages and disadvantages, for example the advantage of a SAR ADC is lower power consumption and higher accuracy, and the disadvantage of it is that a conversion speed is limited by the process and difficult to improve; the advantage of a FLASH ADC is fast, but the disadvantages of it are also obvious: the lower accuracy and the larger power consumption.

In recent years with the development of ADCs, each performance of the single structure ADCs has approached its process limitation. However, due to the drive of Moore's Law in the chip industry, the market has become more and more strict on the demand of the performances of ADCs, thus, in recent years, hybrid-structure ADCs (hybrid ADCs) have begun to become a new mainstream structure; the hybrid structure ADCs are ADCs generally based on SAR ADCs, and mixed with other structures. Such mixed forms of ADCs will inherit the characteristics of SAR ADCs and other structural ADCs, and their performance space and design difficulty will be greater. However, if the designer does not handle them properly, the performances of the hybrid ADCs will be inferior to the single structure ADCs. For example, the FLASH-SAR ADCs, which are mixes of the resistor-divided FLASHs and the capacitor array SARs, but the mixing effect is not ideal. On one aspect, due to the huge power consumption of FLASHs, the advantage of FLASH-SARs with low power consumption is not obvious. Although their main body are still SARs with low power consumption, FLASH-SARs have a little advantage of speed compared to pure SARs, but the power consumption of the FLASH-SARs is much higher than the pure SARs. On another aspect, firstly, a resistor-divided FLASH is not friendly to differential signals, and secondly it uses multiple comparators, and is too sensitive to the offset of the comparators. All the conversion actions of the SARs are implemented based on the switching of the capacitor array (CDAC) combining with comparator's operation of sampling differential signals (voltages), thus the SARs have not these two defects. However when a resistor-divided FLASH is mixed with a SAR to complete a conversion, these new defects will be introduced, resulting that the FLASH-SAR ADC requires a higher cost than a pure SAR ADC for achieving the same accuracy, such as more strict design requirements, and even unavoidable extra speed loss.

SUMMARY

The main purpose of the present application is to provide an N-bit hybrid structure analog-to-digital converter, which aims to implement the hybrid structure of FLASH and SAR at a minimum cost.

In order to implement the above purpose, the present application provides an N-bit hybrid structure analog-to-digital converter, which includes a pre-stage sampling capacitor array, a post-stage capacitor array and a comparator set. The pre-stage sampling capacitor array includes a number of $2^N-1$ sets of first capacitor array units arranged in parallel. Each of the first capacitor array units includes two sets of parallel capacitor strings. Input terminals of the parallel capacitor strings are connected to and switchable between differential analog signals and first preset reference signals. Output terminals of the parallel capacitor strings are respectively connected to corresponding input terminals of the comparator set. Input terminals of the post-stage capacitor array are respectively connected to and switchable between output terminals of the comparator set and differential analog signals. Output terminals of the post-stage capacitor array are configured as an output terminal of the analog-to-digital converter. The comparator set includes a number of $2^N-1$ comparator units, and the comparator unit includes two comparators with opposite phase outputs. Two input terminals of the comparator are connected to two output terminals of each of the corresponding first capacitor array unit. Output terminals of the comparators are configured as the output terminals of the comparator set and connected to the input terminals of the post-stage capacitor array.

Optionally, the parallel capacitor string includes a number of $2^{N-1}$ first capacitors connected in parallel. Upper plates of each of the first capacitor are connected together as an output terminal of the parallel capacitor strings. A lower plate of each of the first capacitor is connected with a first switch. The first switch switches the lower plate of each of the first capacitors between the differential analog signals and the first preset reference signals.

Optionally, the first preset reference signals are divided into two channels, and the two channels of the first preset reference signals are respectively connected to the first switches of the two sets of parallel capacitor strings of a same first capacitor array. The first preset reference signals are $2^N$-bit binary signals.

Optionally, a number of high level bits of the first preset reference signals are $2^{N-1}$ or $2^{N-1}-1$.

Optionally, the first switch is a single-pole three-throw switch.

Optionally, the post-stage capacitor array includes two second capacitor array units, and each of the second capacitor array unit includes a number of $2^N$ second capacitors connected in parallel. Upper plates of each of the second capacitors are connected together as an output of the post-stage capacitor array. A lower plate of each of the second capacitor is connected with a second switch. A number of $2^N-1$ second capacitors are connected to and switchable between the differential analog signals and output terminals of the corresponding comparators. The second switch switches the remaining one of the second capacitors between the differential analog signal and the second preset reference signal.

Optionally, the second preset reference signals connected to two second capacitor array units are the same.

Optionally, the second switch is a single-pole double-throw switch.

The present application also provides an integrated circuit chip, the chip includes an N-bit hybrid structure analog-to-digital converter, which includes a pre-stage sampling capacitor array, a post-stage capacitor array and a comparator set. The pre-stage sampling capacitor array includes a number of $2^N-1$ sets of the first capacitor array units arranged in parallel. Each of the first capacitor array units includes two sets of parallel capacitor strings. Input terminals of the parallel capacitor strings are connected to and switchable differential analog signals and first preset reference signals. Output terminals of the parallel capacitor strings are respectively connected to corresponding input terminals of the comparator set. Input terminals of the post-stage capacitor array are respectively connected to and switchable between the output terminals of the comparator set and differential analog signals. Output terminals of the post-stage capacitor array are configured as the output terminal of the analog-to-digital converter actual quantization module. The comparator set includes a number of $2^N-1$ comparator units, and the comparator unit includes two comparators with opposite phase outputs. Two input terminals of each of the comparators are connected to two output terminals of the corresponding first capacitor array unit. Output terminals of the comparators are configured as an output terminal of the comparator set and connected to the input terminals of the post-stage capacitor array.

Optionally, the parallel capacitor string includes a number of $2^{N-1}$ first capacitors connected in parallel. Upper plates of each of the first capacitor are connected together as an output terminal of the parallel capacitor strings. A lower plate of each first capacitor is connected with a first switch. The first switch switches the lower plate of each of the first capacitors between the differential analog signals and the first preset reference signals.

Optionally, the first preset reference signals are divided into two channels, and the two channels of the first preset reference signals are respectively connected to the first switches of the two sets of parallel capacitor strings of a same first capacitor array. The first preset reference signals are $2^N$-bit binary signals.

Optionally, the number of high level bits of the first preset reference signal is $2^{N-1}$ or $2^{N-1}-1$.

Optionally, the first switch is a single-pole three-throw switch.

Optionally, the post-stage capacitor array includes two second capacitor array units. Each of the second capacitor array unit includes a number of $2^N$ second capacitors connected in parallel. Upper plates of each of the second capacitor are connected together as an output of the post-stage capacitor array. A lower plate of each of the second capacitors is connected with a second switch. A number of $2^N-1$ second capacitors are connected to and switchable between differential analog signals and corresponding output terminals of the comparator. The second switch switches the remaining one of the second capacitors between the differential analog signal and the second preset reference signal.

Optionally, the second preset reference signals connected to two second capacitor array units are the same.

Optionally, the second switch is a single-pole double-throw switch.

The N-bit hybrid structure analog-to-digital converter and the integrated circuit chip including the same of the technical solution of the present application sample differential analog signals via a number of $2^N-1$ first capacitor array units, and then coarsely discretizes the sampled differential analog signals using the first preset reference signal. The analog signals sampled by each of the first capacitor array units are discretized to form a reference voltage scale, thus a total of $2^N-1$ reference voltage scales are formed, which means that the sampled analog signals are discretized to discrete signals distributed within $2^N$ discrete intervals. Since the differential analog signals are divided into two channels of differential analog signals for transmission, which have the same amplitude and opposite phase. Each of the first capacitor array units includes two sets of parallel capacitor strings. One set of the parallel capacitor strings samples one channel of the differential signals and the two channels of the differential signals are transmitted to an input terminal of a comparator unit in the comparator set. The output of the comparator unit is used as the result of the coarse pre-stage discretization. This result is set to determine which one of the above-described $2^N$ discrete intervals the sampled analog signals fall into. The output of the comparator unit is then transmitted to the post-stage capacitor array for residual quantization, so that a N-bit coarse conversion of the sampled analog signals is completed. The N-bit hybrid structure analog-to-digital converter is formed with a pure capacitor array, and the pure capacitor array is friendly to the analog differential signals. The two channels of the analog differential signals can share a comparator unit, resulting that the number of comparators is reduced by half as compared to the exemplary resistor-divided FLASH, the power consumption of the entire integrated chip is reduced accordingly, and meanwhile the desensitization to mismatch of the comparators is increased. In addition, since the N-bit hybrid structure analog-to-digital converter adopts a pure capacitor array for conversion, there is no additional cost in the hybrids of the pre-stage and the post-stage.

BRIEF DESCRIPTION OF THE DRAWINGS

To illustrate the technical solutions according to the embodiments of the present application or in the prior art more clearly, the accompanying drawings for describing the embodiments or the prior art are introduced briefly in the following. Apparently, the accompanying drawings in the following description only show only a part rather than all embodiments of the present application. All other embodiments obtained by one skilled in the art based on the given embodiments without creative efforts shall fall in the scope of the present application.

FIG. 1 is a schematic block diagram of a circuit structure of an N-bit hybrid structure analog-to-digital converter according to an embodiment of the present application.

Description of drawing labels:

| label | name | label | name |
| --- | --- | --- | --- |
| 100 | pre-stage sample capacitor array | 110 | the first capacitor array unit |
| 200 | comparator set | 210 | comparator unit |
| 300 | post-stage capacitor array | 310 | the second capacitor array unit |

The implementation of the purpose, functional characteristics and advantages of the present application will be further described in conjunction with the embodiments and with reference to the drawings.

DETAILED DESCRIPTION OF THE EMBODIMENTS

The technical solutions of the embodiments of the present application will be clearly and completely described in the following with reference to the accompanying drawings. It is obvious that the embodiments to be described are only a part rather than all of the embodiments of the present application. All other embodiments obtained by one skilled in the art based on the embodiments of the present application without creative efforts shall fall within the protection scope of the present application.

It is to be understood that, all of the directional instructions in the exemplary embodiments of the present application (such as top, down, left, right, front, back . . . ) can only be used for explaining relative position relations, moving condition, and so on, of the elements under a special form (referring to figures). If the special form changes, the directional instructions changes accordingly.

In addition, the descriptions, such as the "first", "second" in the present application, are only used for describing purpose, and cannot be understood as indicating or suggesting relative importance or impliedly indicating the number of the indicated technical character. Therefore, the feature following the "first" or "second" only expressly or impliedly indicates that at least one such feature is included. In addition, the technical solutions of each exemplary embodiment can be combined with each other, however the combination of any of the technical solutions must is only based on that one skilled in the art can achieve the combinations. When the combination of any of the technical solutions occurs contradiction or cannot be implemented, it should consider that the combination of the technical solutions does not existed, and is not contained in the protection scope of the present application.

The present application provides an N-bit hybrid structure analog-to-digital converter.

Referring to FIG. 1, FIG. 1 is a schematic block diagram of a circuit structure of an N-bit hybrid structure analog-to-digital converter according to an embodiment of the present application.

In the embodiments of the present application, a four-bit hybrid structure analog-to-digital converter is used as an example for illustration. Other N-bit hybrid structure analog-to-digital converters can be obtained with reference to the four-bit hybrid structure analog-to-digital converter and are not described herein one by one.

Shown in FIG. 1, the four-bit hybrid structure analog-to-digital converter includes a pre-stage sampling capacitor array 100, a post-stage capacitor array 300 and a comparator set 200. The pre-stage sampling capacitor array 100 includes $2^N-1=2^4-1=15$ sets of first capacitor array units 110 arranged in parallel, and each of the first capacitor array units 110 includes two sets of parallel capacitor strings. Input terminals of the parallel capacitor strings are connected to and switchable between differential analog signals and first preset reference signals. Output terminals of the parallel capacitor strings are respectively connected to the corresponding input terminals of the comparator set 200. Input terminals of the post-stage capacitor array 300 are respectively connected to and switchable between output signals of the comparator set 200 and differential analog signals. Output terminals of the post-stage capacitor array 300 are configured as an output terminal of the analog-to-digital converter.

The four-bit hybrid structure analog-to-digital converter of the technical solution of the present application samples differential analog signals via the $2^4-1=15$ first capacitor array units 110, and then coarsely discretizes the sampled differential analog signals using the first preset reference signals. The differential analog signals sampled by each of the first capacitor array units 110 are discretized to form a reference voltage scale, thus a total of $2^N-1=2^4-1=15$ reference voltage scales are formed, which means that the sampled analog signals are discretized to discrete signals distributed within $2^N=2^4=16$ discrete intervals. In this embodiment, preferably, the differential analog signals are used and are divided into two channels of differential analog signals for transmission, which have the same amplitude but opposite phase. Each of the first capacitor array units 110 includes two sets of parallel capacitor strings. One set of the parallel capacitor strings samples one channel of the differential signals and the two channels of the differential signals are transmitted to an input terminal of a comparator unit 210 of the comparator set 200. The output of the comparator unit 210 is used as the result of the coarse pre-stage discretization. This result is set to determine which one of the above-described $2^N=2^4=16$ discrete intervals the sampled analog signals fall into. The output of the comparator unit 210 is then transmitted to the post-stage capacitor array 300 for residual quantization, so that a N-bit coarse conversion of the sampled analog signals is completed. The N-bit hybrid structure analog-to-digital converter is formed with a pure capacitor array, and the pure capacitor array is friendly to the analog differential signals. The two channels of the analog differential signals share a comparator unit, resulting that the number of comparators is reduced by half as compared to the exemplary resistor-divided FLASH, the power consumption of the entire integrated chip is reduced accordingly, and meanwhile the desensitization to mismatch of the comparators is increased. In addition, since the N-bit hybrid structure analog-to-digital converter adopts a pure capacitor array for conversion, there is no additional cost in the hybrids of the pre-stage and the post-stage.

Furthermore, the parallel capacitor string includes a number of $2^{N-1}$ first capacitors connected in parallel. Upper plates of the first capacitors are connected together as the output terminal of the parallel capacitor strings, and a lower plate of each of the first capacitors is connected with a first switch. The first switch switches the lower plate of each of the first capacitor being connected to the differential analog signals or the first preset reference signal. The first preset reference signals are divided into two channels, and the two channels of first preset reference signals are respectively connected to the first switch of the two sets of parallel capacitor strings of a same first capacitor array unit 110. The first preset reference signals are $2^N=2^4=16$-bit binary signals. A number of high level bits of the first preset reference signals are $2^{N-1}=2^{4-1}=2^3=8$ or $2^{N-1}-1=2^{4-1}-1=2^3-1=7$. The first switch is a single-pole three-throw switch.

In this embodiment, the number of discrete intervals being $2^N$, a total number of the capacitors in each of the first capacitor array unit 110 is $2^N=2^4=16$ accordingly. Since the differential signals are divided into two channels of differential inputs, each of the first capacitor array unit 110 is also divided into two sets of parallel capacitor strings, and the number of the first capacitors in each of the parallel capacitor strings is $2^N/2=2^{N-1}=2^{4-1=23}=8$. The first preset reference signals are also divided into two sets. The total number of bits of the first preset reference signals is $2^N$, then the number of bits of the first preset reference signals of each set is $2^N/2=2^{N-1}=2^{4-1}=2^3=8$. In this embodiment, the high level $V_{refp}$ is "1" and the low level $V_{refn}$ is "0".

Firstly, the first switch is controlled to connect the lower plate of each of the first capacitor to the corresponding differential analog signals. When the sampling of the lower plates of the first capacitors are completed, voltages of the lower plates of the first capacitors of the two sets of the parallel capacitor strings are respectively $V_{in}, V_{ip}$. Then, the first switch is controlled to connect the lower plate of each of the first capacitor to the first reference signals. If the lower plate of a first capacitor is connected to the high level $V_{refp}$, a voltage of the upper plate of the first capacitor is increased by $V_{refp}/2^{N-1}=V_{refp}/2^{4-1}=V_{refp}/2^3=V_{refp}/8$ based on $V_{in}$ or $V_{ip}$. If the lower plate of a first capacitor is connected to the low level $V_{refn}$, a voltage of the upper plate of the first capacitor is $V_{in}$ or $V_{ip}$. An equivalent voltage of the first capacitor array unit 110 is the difference $V_{ip}-V_{in}+V_Y-V_X$ between voltages of the upper plates of the first capacitors of the two sets of parallel capacitor strings.

It is assumed that $2^{N-1}=2^{4-1}=2^3=8$ bits of the first preset signals connected to the lower plate of the first capacitor of one set of the parallel capacitor strings are $X_0, X_1, X_2, X_3, X_4, X_5, X_6, X_7$, and $2^{N-1}=2^{4-1}=2^3=8$ bits of the first preset signals of the lower plate of the first capacitor of another set of the parallel capacitor strings are $Y_0, Y_1, Y_2, Y_3, Y_4, Y_5, Y_6, Y_7$, then the first preset reference signals can be set according to the following table:

| Serial number | $X_7$–$X_0$ | $Y_7$–$Y_0$ | $V_y - V_x$ equivalent reference voltage |
|---|---|---|---|
| the first set | 00000000 | 11111110 | $+7/8 * V_{refp}$ |
| the second set | 00000001 | 11111110 | $+6/8 * V_{refp}$ |
| the third set | 00000001 | 11111100 | $+5/8 * V_{refp}$ |
| the fourth set | 00000011 | 11111100 | $+4/8 * V_{refp}$ |
| the fifth set | 00000011 | 11111000 | $+3/8 * V_{refp}$ |
| the sixth set | 00000111 | 11111000 | $+2/8 * V_{refp}$ |
| the seventh set | 00000111 | 11110000 | $+1/8 * V_{refp}$ |
| the eighth set | 00001111 | 11110000 | 0 |
| the ninth set | 00001111 | 11100000 | $-1/8 * V_{refp}$ |
| the tenth set | 00011111 | 11100000 | $-2/8 * V_{refp}$ |
| the eleventh set | 00011111 | 11000000 | $-3/8 * V_{refp}$ |
| the twelfth set | 00111111 | 11000000 | $-4/8 * V_{refp}$ |
| the thirteenth set | 00111111 | 10000000 | $-5/8 * V_{refp}$ |
| the fourteenth set | 01111111 | 10000000 | $-6/8 * V_{refp}$ |
| the fifteenth set | 01111111 | 00000000 | $-7/8 * V_{refp}$ |

According to the above table, a number of $2^N-1=2^4-1=15$ reference voltage scales are obtained via the pre-stage capacitor array 100, and a number of $2^N-1+1=2^4-1+1=16$ discrete voltage intervals are formed accordingly: [$\leq -7/8*V_{refp}$], [$-7/8*V_{refp}$], [$-6/8*V_{refp}$], [$-6/8*V_{refp}$, $-5/8*V_{refp}$], [$-5/8*V_{refp}$, $-4/8*V_{refp}$], [$-4/8*V_{refp}$, $-3/8*V_{refp}$], [$-3/8*V_{refp}$, $-2/8*V_{refp}$], [$-2/8*V_{refp}$, $-1/8*V_{refp}$], [$-1/8*V_{refp}$, 0], [0, $+1/8*V_{refp}$], [$+1/8*V_{refp}$, $+2/8*V_{refp}$], [$+2/8*V_{refp}$, $+3/8*V_{refp}$], [$+3/8*V_{refp}$, $+4/8*V_{refp}$], [$+4/8*V_{refp}$, $+5/8*V_{refp}$], [$+5/8*V_{refp}$, $+6/8*V_{refp}$], [$+6/8*V_{refp}$, $+7/8*V_{refp}$], [$\geq +7/8*V_{refp}$]. After loading the first preset reference signals in the above table on the lower plate of each of the first capacitors, the differential analog signals will be discretized within the above 16 discrete intervals.

Optionally, the comparator set 200 includes a number of $2^N-1$ comparator units 210. Each of the comparator units 210 includes two comparators with outputs of opposite phase. Two input terminals of each of the comparators are connected to two outputs of a corresponding first capacitor array unit 110. The outputs of the comparators are used as the output of the comparator set 200, and connected to the input terminals of the post-stage capacitor array 300.

A loading level of a second capacitor in the post-stage capacitor array 300 is controlled according to the result of the comparator. When $V_Y > V_X$, that is, when $V_Y$ is the high level and the corresponding $V_X$ is the low level, one of the comparators outputs the high level, and the other comparator outputs the low level. When $V_Y < V_X$, that is, when $V_Y$ is the low level and the corresponding $V_X$ is the high level, one of comparators outputs the low level, and the other comparator outputs the high level. The results of the two sets of comparators are respectively output to two second capacitor array units 310, thus to obtain a residual interval after the coarse discretization.

Optionally, the post-stage capacitor array 300 includes two second capacitor array units 310, and each of the second capacitor array units 310 includes a number of $2^N=2^4=16$ second capacitors connected in parallel. Upper plates of each of the second capacitors are connected together as the output of the post-stage capacitor array 300. A lower plate of each of the second capacitors is connected with a second switch. A number of $2^N-1=2^4-1=15$ second capacitors of the second capacitors are switched to connect to the differential analog signals or to the outputs of corresponding comparators via the corresponding second switches, the remaining one of the second capacitors is switched to connect to the differential analog signals or to a second preset reference signal via the corresponding second switch. The second preset reference signals connected to the two second capacitor array units 310 are the same. The second switches are single-pole double-throw switches.

In this embodiment, since the output of each of the comparators is only a $2^N-1=2^4-1=15$-bit binary signal, a $2^N=2^4=16$-bit binary signal can be obtained by loading the second preset reference signal on one of the second capacitors. Since two channels of differential analog signals are used as the second preset reference signal, thus the voltage output of the post-stage capacitor array 300 is the difference between the upper plates of the second capacitors of each of the two second capacitor array units 310. The second preset reference signals are set to be the same, and are offset by subtracting one of the second preset reference signals to the other, thereby not effecting the other $2^N-1=2^4-1=15$-bit binary signal.

For example, when $V_{ip}-V_{in}$ falls into the [$+1/8*V_{refp}$, $+2/8*V_{refp}$] interval, the output of one of comparators is 000000111111111, and the output of the other comparator is 111111000000000, the $2^N-1=2^4-1=15$ switches of one of the second capacitor array units 310 should be connected to the $V_{refn}$, $V_{refn}$, $V_{refn}$, $V_{refn}$, $V_{refn}$, $V_{refn}$, $V_{refn}$, $V_{refp}$, $V_{refp}$, $V_{refp}$, $V_{refp}$, $V_{refp}$, $V_{refp}$, $V_{refp}$, and $V_{refp}$, and the 15 switches of the corresponding another second capacitor array unit 310 should be connected to the $V_{refp}$, $V_{refp}$, $V_{refp}$, $V_{refp}$, $V_{refp}$, $V_{refp}$, $V_{refp}$, $V_{refn}$, $V_{refn}$, $V_{refn}$, $V_{refn}$, $V_{refn}$, $V_{refn}$, $V_{refn}$, and $V_{refn}$. Thus, $V_{op}-V_{on}=(10/16)\times V_{refp}-V_{in}-[(7/16)\times V_{refp}-V_{ip}]=V_{ip}-V_{in}-3/16\times V_{refp}$, a value of which will fall into the [$-1/16*V_{refp}$, $+1/16*V_{refp}$] interval which is the residual interval of the 4-bit coarse discretization. If $V_{ip}-V_{in}$ is another value, similarly after a coarse conversion, the residual will fall into the [$-1/16*V_{refp}$, $+1/16*V_{refp}$] interval, and be provided for the next level conversion.

The present application also provides an integrated circuit chip, which includes the N-bit hybrid structure analog-to-digital converter. The structure, working principle and technical effects of the N-bit hybrid structure analog-to-digital converter of the integrated circuit chip can refer to the above embodiments, and descriptions relate thereto are omitted.

The foregoing description merely portrays some illustrative embodiments of the present application and is not intended to limit the patentable scope of the present application. Any equivalent structural or flow transformations that are made taking advantage of the specification and accompanying drawings of the present application and any direct or indirect applications thereof in other related technical fields shall all fall in the scope of protection of the present application.

What is claimed is:

1. An N-bit hybrid structure analog-to-digital converter comprising a pre-stage sampling capacitor array, a post-stage capacitor array and a comparator set, the pre-stage sampling capacitor array comprising a number of $2^N-1$ sets of first capacitor array units arranged in parallel, each of the first capacitor array units comprising two sets of parallel capacitor strings, input terminals of the parallel capacitor strings being connected to and switchable between differential analog signals and first preset reference signals, output terminals of the parallel capacitor strings being respectively connected to corresponding input terminals of the comparator set, input terminals of the post-stage capacitor array respectively being connected to and switchable between output terminals of the comparator set and differential analog signals, output terminals of the post-stage capacitor array being configured as an output terminal of the analog-to-digital converter, the comparator set comprising a number of $2^N-1$ comparator units, the comparator unit comprising two comparators with opposite phase outputs, and two input terminals of each of the comparators being connected to two output terminals of the corresponding first capacitor array unit, output terminals of the comparators being configured as output terminals of the comparator sets and being connected to input terminals of the post-stage capacitor array.

2. The N-bit hybrid structure analog-to-digital converter according to claim 1, wherein the parallel capacitor string comprises a number of $2^N-1$ first capacitors connected in parallel, and upper plates of each of the first capacitors are connected together as an output terminal of the parallel capacitor strings, and a lower plate of each of the first capacitors is connected with a first switch, and the first switch switches the lower plate of each of the first capacitors between the differential analog signals and the first preset reference signals.

3. The N-bit hybrid structure analog-to-digital converter according to claim 2, wherein the first preset reference signals are divided into two channels, and the two channels of the first preset reference signals are respectively connected to the first switches of the two sets of parallel capacitor strings of a same first capacitor array, and the first preset reference signals are $2^N$-bit binary signals.

4. The N-bit hybrid structure analog-to-digital converter according to claim 3, wherein a number of high level bits of the first preset reference signals is $2^{N-1}$ or $2^{N-1}1$.

5. The N-bit hybrid structure analog-to-digital converter according to claim 2, wherein the first switch is a single-pole three-throw switch.

6. The N-bit hybrid structure analog-to-digital converter according to claim 1, wherein the post-stage capacitor array comprises two second capacitor array units, and each of the second capacitor array units comprises a number of $2^N$ second capacitors connected in parallel, and upper plates of each of the second capacitors are connected together as an output of the post-stage capacitor array, and a lower plate of each of the second capacitors is connected with a second switch, wherein a number of $2^N-1$ second capacitors are connected to and switchable between the differential analog signals and output terminals of the corresponding comparators, and the second switch switches the remaining one of the second capacitors between the differential analog signal and a second preset reference signal.

7. The N-bit hybrid structure analog-to-digital converter according to claim 6, wherein the second preset reference signals connected to two second capacitor array units are the same.

8. The N-bit hybrid structure analog-to-digital converter according to claim 6, wherein the second switch is a single-pole double-throw switch.

9. An integrated circuit chip, comprising an N-bit hybrid structure analog-to- digital converter, which comprising a pre-stage sampling capacitor array, a post-stage capacitor array and a comparator set, the pre-stage sampling capacitor array comprising a number of $2^N-1$ sets of first capacitor array units arranged in parallel, each of the first capacitor array units comprising two sets of parallel capacitor strings, input terminals of the parallel capacitor strings being connected to and switchable between differential analog signals and first preset reference signals, output terminals of the parallel capacitor strings being respectively connected to corresponding input terminals of the comparator set, input terminals of the post-stage capacitor array respectively being connected to and switchable between the output terminals of the comparator set and differential analog signals, output terminals of the post-stage capacitor array being configured as an output terminal of the analog-to-digital converter, the comparator set comprising a number of $2^N-1$ comparator units, the comparator unit comprising two comparators with opposite phase outputs, and two input terminals of each of the comparators being connected to two output terminals of the corresponding first capacitor array unit, output terminals of the comparators being configured as output terminals of the comparator set and being connected to the input terminals of the post-stage capacitor array.

10. The integrated circuit chip according to claim 9, wherein the parallel capacitor string comprises a number of $2^{N-1}$ first capacitors connected in parallel, and upper plates of each of the first capacitor are connected together as an output terminal of the parallel capacitor strings, and a lower plate of each of the first capacitors is connected with a first switch, and the first switch switches the lower plate of each of the first capacitors between the differential analog signals and the first preset reference signals.

11. The integrated circuit chip according to claim 10, wherein the first preset reference signals are divided into two channels, and the two channels of the first preset reference signals are respectively connected to the first switches of the two sets of parallel capacitor strings of a same first capacitor array, and the first preset reference signals are $2^N$-bit binary signals.

12. The integrated circuit chip according to claim 11, wherein a number of high level bits of the first preset reference signals is $2^{N-1}$ or $2^{N-1}-1$.

13. The integrated circuit chip according to claim 10, wherein the first switch is a single-pole three-throw switch.

14. The integrated circuit chip according to claim 9, wherein the post-stage capacitor array comprises two second capacitor array units, and each of the second capacitor array units comprises a number of $2^N$ second capacitors connected in parallel, and upper plates of each of the second capacitors are connected together as an output of the post-stage capacitor array, and a lower plate of each of the second capacitors is connected with a second switch, wherein a number of $2^N-1$ second capacitors are connected to and switchable between the differential analog signals and the corresponding output terminals of comparators, and the second switch switches the remaining one of the second capacitors between the differential analog signal and a second preset reference signal.

15. The integrated circuit chip according to claim 14, wherein the second preset reference signals connected to two second capacitor array units are the same.

16. The integrated circuit chip according to claim 14, wherein the second switch is a single-pole double-throw switch.

* * * * *